(12) United States Patent
Cossoul et al.

(10) Patent No.: US 7,603,599 B1
(45) Date of Patent: Oct. 13, 2009

(54) METHOD TO TEST ROUTED NETWORKS

(75) Inventors: Matthieu P. H. Cossoul, Sunnyvale, CA (US); Madabhushi V. R. Chari, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 925 days.

(21) Appl. No.: 11/144,905

(22) Filed: Jun. 3, 2005

(51) Int. Cl.
*G01R 31/28* (2006.01)
*G06F 7/38* (2006.01)
*G06F 17/50* (2006.01)

(52) U.S. Cl. .......................... 714/725; 716/12; 716/13; 716/14; 716/16; 716/17; 326/38; 326/40; 326/41

(58) Field of Classification Search ................ 714/725; 716/12–14, 16, 17; 326/38, 40, 41
See application file for complete search history.

(56) References Cited

U.S. PATENT DOCUMENTS

| | | | |
|---|---|---|---|
| 6,664,808 | B2 | 12/2003 | Ling et al. |
| 6,817,006 | B1 * | 11/2004 | Wells et al. ............... 716/16 |
| 6,891,395 | B2 * | 5/2005 | Wells et al. ............... 326/38 |
| 7,000,212 | B2 * | 2/2006 | Agrawal et al. ............. 716/17 |
| 7,058,919 | B1 * | 6/2006 | Young et al. .............. 716/12 |
| 7,143,384 | B1 * | 11/2006 | Young et al. .............. 716/12 |
| 7,409,669 | B1 * | 8/2008 | Dastidar et al. ............ 716/16 |
| 2005/0022085 | A1 * | 1/2005 | Vo et al. ................... 714/738 |

OTHER PUBLICATIONS

Mark et al., Localizing Open Interconnect Defects using Targeted Routing in FPGA's, 2004, IEEE, pp. 627-634.*
Stroud et al., Built-In Self-Test of FPGA Interconnect, 1998, IEEE, pp. 404-411.*
Tahoori et al., Fault Grading FPGA Interconnect Test Configurations, 2002, 608-617.*
Tahoori et al., Techniques and Algorithms for Fault Grading of FPGA Interconnect Test Configurations, Feb. 2004, IEEE, vol. 23, No. 2, pp. 261-272.*

* cited by examiner

*Primary Examiner*—John J Tabone, Jr.
(74) *Attorney, Agent, or Firm*—Thomas A. Ward; John J. King; Lois D. Cartier

(57) ABSTRACT

Testing of routing resources in a path between network nodes is provided using simpler nodes to replace more complex IP modules which could be programmed into an FPGA after the routing resources are tested. Further, when it is impractical to generate a pattern from a source node S for testing a network path N to a load, subnetworks are created to perform testing. To provide the subnetworks, a source S' is first provided close to node S that generates signal patterns to route through a path N' to load L. When it is impractical to test a network path N from source to load L, a load L' is further provided close to load L that receives the signal patterns from a routing path N" provided from source S. The paths N' and N" overlap to cover all the routing resources of the path N.

14 Claims, 4 Drawing Sheets

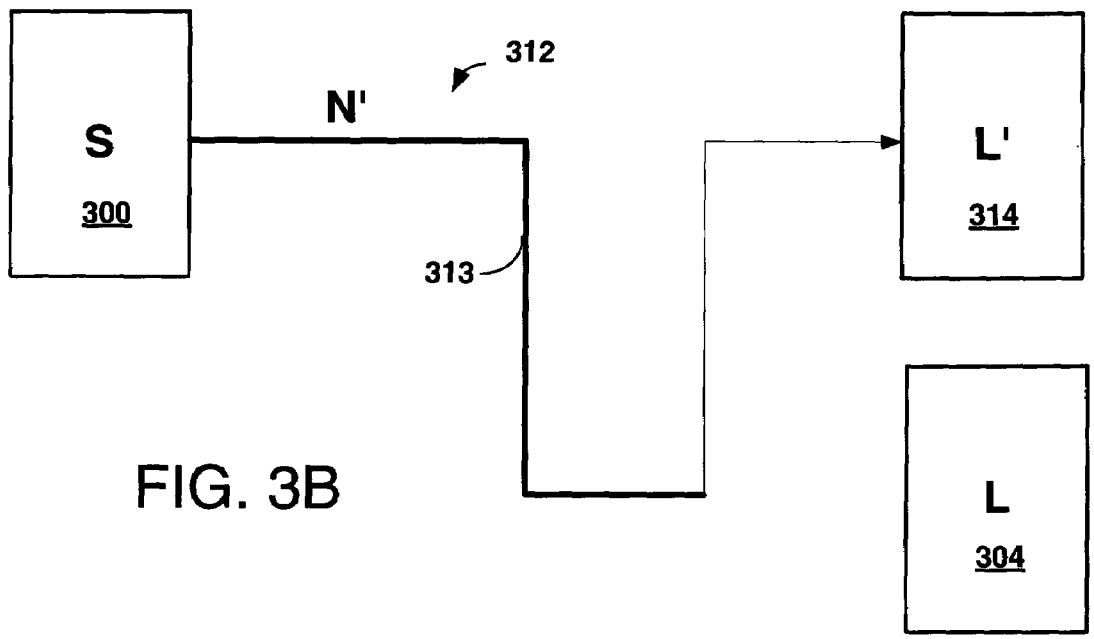
FIG. 3B
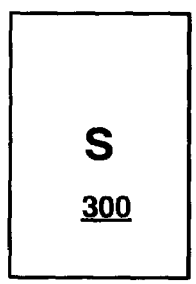
FIG. 3C
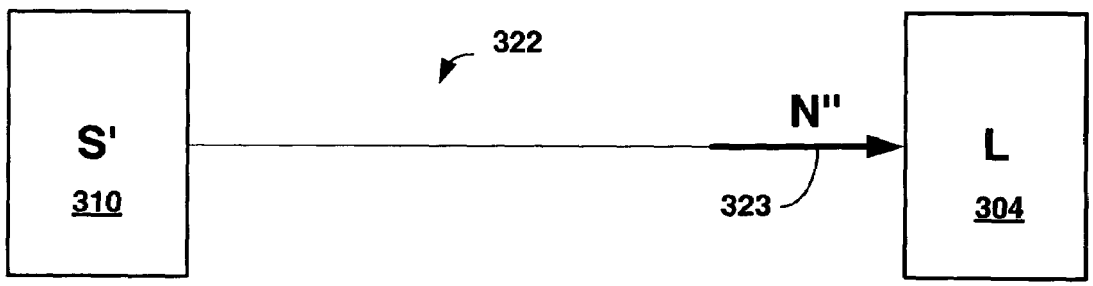

METHOD TO TEST ROUTED NETWORKS

BACKGROUND

1. Technical Field

The present invention relates to testing of routing resources forming a path between a source and load(s) in a network.

2. Related Art

To test resources used by a network, typically a source node is configured as a pattern generator for sending signals through the network routing resource path to another node serving as a load. The patterns generated are configured to simulate all the possible operation conditions and to use all the routing resources connecting the source and load nodes to ensure that the routing resources are functioning properly.

In a programmable circuit such as an FPGA, the source and load nodes can be programmed into the configurable logic blocks (CLBs) and other FPGA resources to create modules. The modules can be complicated Intellectual Property (IP) block circuits that are programmed by a customer into the FPGA after receiving the device from the manufacturer. For a manufacturer to fully test the routing resources, the complex IP blocks must typically be obtained from the third party customer to program into the FPGA to generate the test patterns. For testing the routing resources to or from an IP block, the external source and load devices typically must also be obtained by a manufacturer from a third party. It would be desirable to test the routing resources of a network without the need of first obtaining complex IP from a third party.

With more complex sources and loads, even after obtaining complex IP block modules, testing of the routing resources may be difficult. Challenging control and observation points can prevent generation of patterns needed for testing of the routing resource paths without a host of additional communications over the routing network paths. The challenging control and observation points, thus, prevent a guaranteed 100% fault test coverage of the resources to and from the IP. A complex and time consuming test procedure may be impractical for manufacturers. It would be desirable to provide a method of testing routing resources between complex IP modules using a minimum amount of test sequence steps to test all the routing resources.

SUMMARY

Embodiments of the present invention provide a system for testing routing resources between nodes in a network that use simpler structures than more complex IP modules to form source and load nodes to test the routing resources. Further, to avoid use of challenging control and observation points that may not easily allow transmission of signal patterns between a source and load, the network is broken into easier to test subnetworks to allow all routing resources to be easily tested.

For testing of routing resources, when complex IP modules are to be programmed to form the nodes, the more complex modules can be initially replaced by pattern generator modules such as FPGA slices that function to generate test patterns. The more complex modules are programmed into the FPGA after the routing resources are tested by a third party consumer, eliminating the need of a manufacturer to obtain the complex modules. In one embodiment, a module to generate patterns can be formed in an FPGA using a simple Look Up Table (LUT) and flip-flop of the slice.

Subnetworks are further created for test purposes when it is impractical to generate a test signal at a source node S that can be provided on a network routing path N to the load node L. The subnetwork is created as follows. Initially, a node S' is created and connected by a routing path N' to the load node L, i.e. node S' is not a part of the network routing path N. The routing path N' is configured to overlap a first portion of the routing path N connecting to the load L to allow ease in testing of the first portion of the routing path. The node S' is placed as close as possible to the source S to minimize routing resources required. Further, when it is impractical to test the remaining network path N from source to load L, a load L' is created and connected by a routing path N" from the source S to the load L', i.e. node L' is not a part of the network routing path N. The routing path N" overlaps a second portion of the routing path N connecting to the source such that the path N' and N" combined cover all routing resources used by the path N. The load L', similar to source S', is placed as close as possible to the load L to minimize routing resource overload.

BRIEF DESCRIPTION OF THE DRAWINGS

Further details of the present invention are explained with the help of the attached drawings in which:

FIG. 3B shows a network routing path N' from the source node S to a load node L'; and FIG. 3C shows a network routing path N" from the source node S' to a load node L.

DETAILED DESCRIPTION

A routed network can be implemented in components of a general IC, or a more specific IC such as an FPGA. Similarly, the routed network can be provided with multiple IC components. Embodiments of the present invention can be implemented within a single IC, or using multiple ICs, whether or not the ICs include an FPGA. For convenience, however, the following description of embodiments of the present invention will be described with respect to a routed network provided within the confines of an FPGA. For reference, components provided in an FPGA are first described with respect to FIG. 1.

Figure 1:
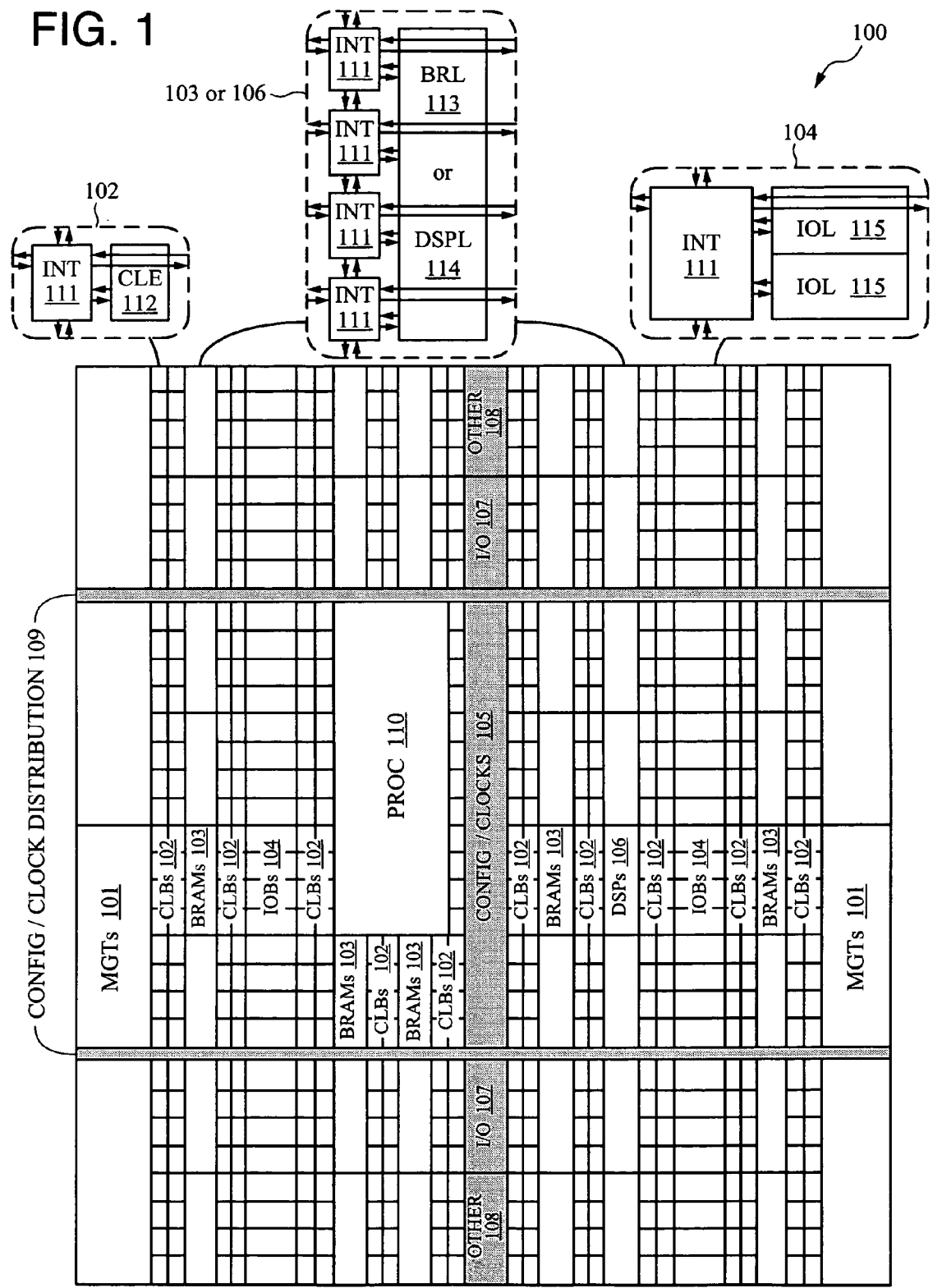
FIG. 1 illustrates components included in an FPGA.

FIG. 1 provides an overview of typical components included in an FPGA. The components include a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. The FPGA can also include a dedicated processor blocks (PROC 110).

Each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

For testing of routing resources, when complex IP blocks or modules are to be programmed to form the nodes, the more complex modules in one embodiment are initially replaced by less complex modules for testing routing resources between modules. Either some or all of the complex modules can be replaced. The more complex modules are reprogrammed into the FPGA after the routing resources are tested, eliminating the need of a manufacturer to obtain the complex modules from a third party. Complex IP blocks can consume multiple CLBs, BRAM and other components of an FPGA. In one embodiment, less complex FPGA slices can be programmed to generate the test modules and removed once testing is complete. In some of the Virtex family of FPGAs manufactured by Xilinx, a logic slice contains two 4-input lookup tables (LUTs), two configurable D-flip flops, multiplexers, dedicated carry logic, and gates used for creating slice based multipliers An even more simple module can be formed in an FPGA using a single Look Up Table (LUT) and flip-flop.

To test routing resources used by a network, the source node S of the network is instrumented as a pattern generator and the load node L is configured as an observation point. The source node S and the load node L can be programmed into the FPGA using simpler modules S' and L', using components limited to an FPGA slice, capable of generating desired test patterns.

Figure 2A:
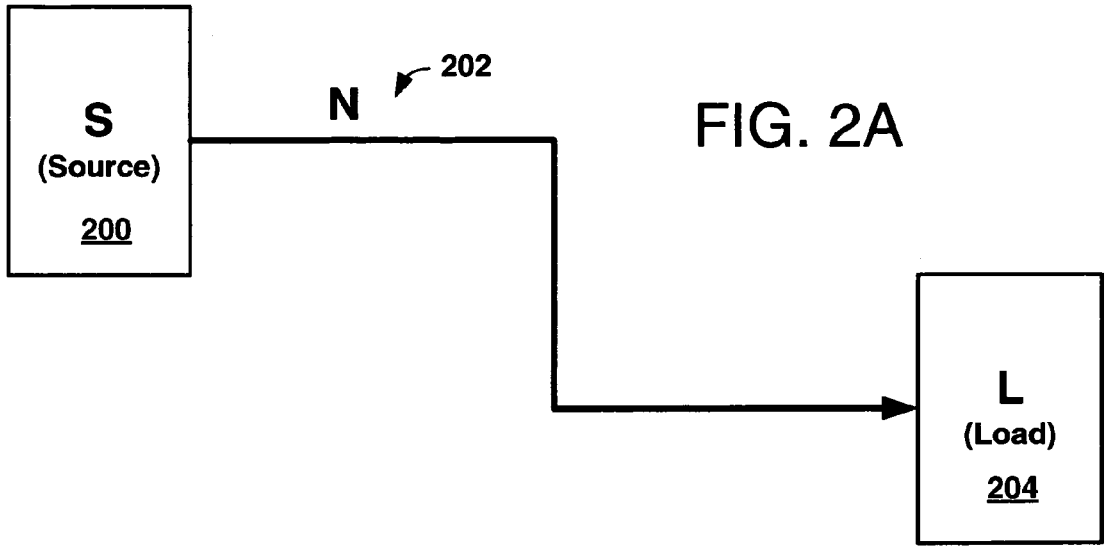
FIG. 2A shows a network routing path N from a source node S to a load node L.
Figure 2B:
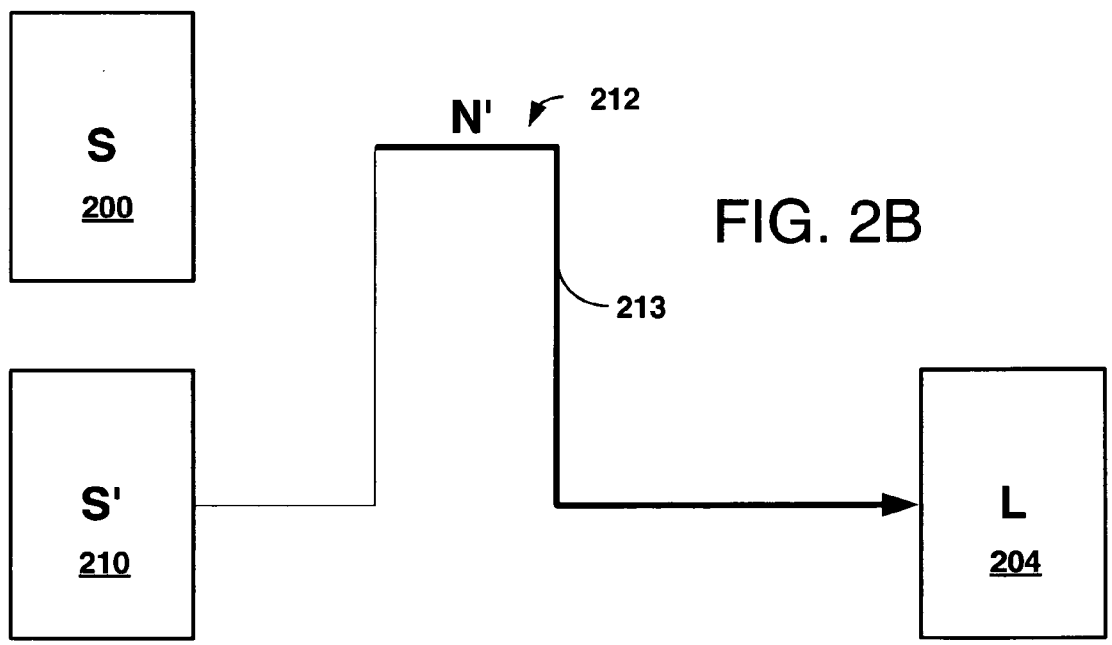
FIG. 2B shows a network routing path N' from a source S' to the load L.
Figure 2C:
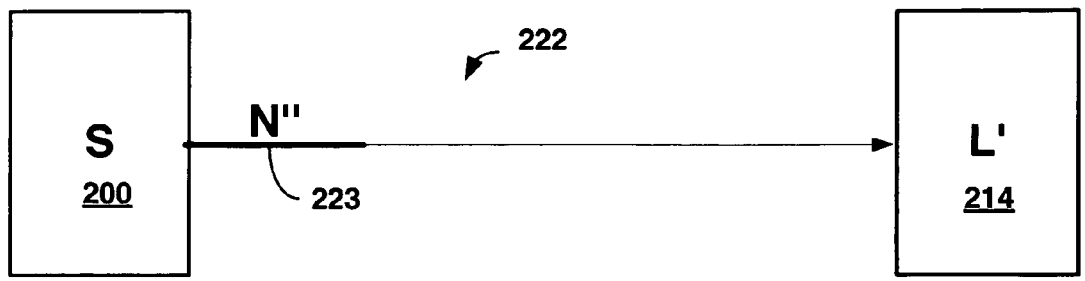
FIG. 2C shows a network routing path N" from the source S to a load L".

Subnetworks are further created for test purposes when it is impractical to generate or receive signals using complex IP modules. A first subnetwork is created as illustrated in FIGS. 2A-2C when it is impractical to generate test signal patterns from a source node S. FIG. 2A illustrates the initial setup with the complex source node S 200 as connected to a load node L 204 by routing path N 202. With this system a two step procedure is performed to test routing resources beginning with a first step illustrated in FIG. 2B. A node S' 210 is first created and connected by a routing path N' 212 to the load node L 204. The routing path N' 212 overlaps a first portion 213 of the routing path N 202 connecting to the load L 204 shown by the darkened line in FIG. 2B. The node S' 210 is placed as close as possible to the source S 200 to minimize routing resources required. In a second step illustrated by FIG. 2C, a load L' 214 is created and connected by a routing path N" 222 from the source S 200 to the load L' 214. The routing path N" 222 overlaps a second portion 223 of the routing path N 202 connecting to the source S 200 as shown by the darkened line. The first portion 213 and second portions 223 of the routing path N 202 covered by darkened portions of the paths N' 212 and N" 222 are combined to cover all routing resources used by the path N 202. Thus, generating test signal patterns from source S 200 and source S' 210 and providing them over the routing paths N' 212 and N" 222 will test all the routing resources of the routed network N 202. The load L' 214, similar to source S' 210, is placed as close as possible to the load L 204 to minimize routing resource overhead.

In an alternative embodiment, the second step shown in FIG. 2C is unnecessary if the darkened portion 223 of the network routing path N is covered by a feature test of the source S 200. A feature test of the source S 200 tests the routing resources in close proximity to the outputs of the source S, so if splicing of the routing path N to form the portion 223 took place at the nearest connection to the source S 200, testing of the darkened portion can be provided without creating path N" 222 and load L' 214.

Figure 3A:
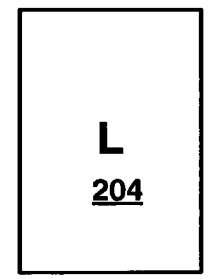
FIG. 3A shows a network routing path N from a source node S to a load node L.
Figure 3A:
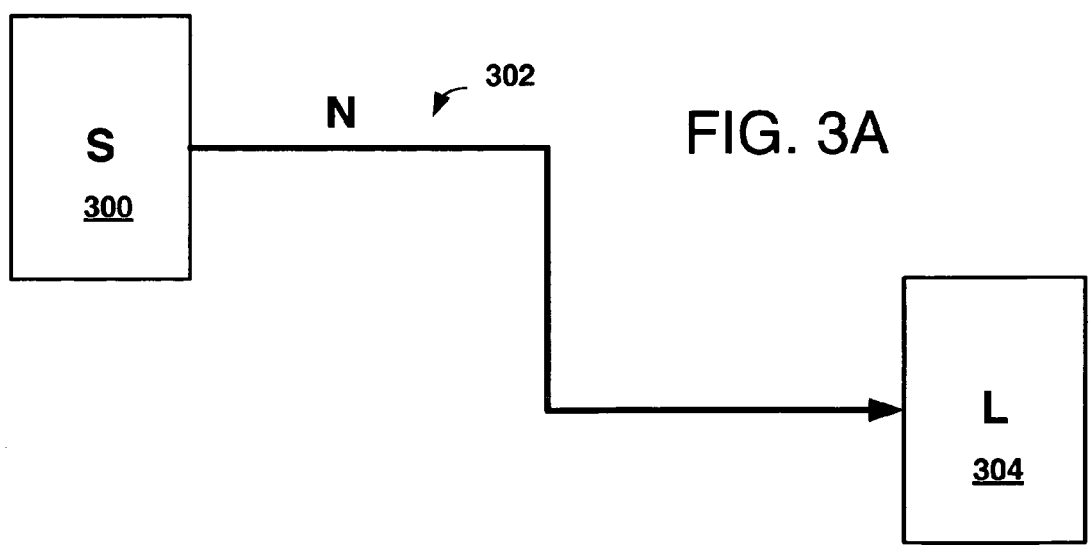

Subnetworks are further created for test purposes when it is impractical to receive a test signal using a complex load L as illustrated by FIGS. 3A-3C. FIG. 3A illustrates an initial setup where a complex load node L 304 is connected to a source node S 300 by routing path N 302. With this system, a two step procedure is performed to test routing resources beginning with a first step illustrated in FIG. 2B. A load L' 314 is first created and connected by a routing path N' 312 to the source node S 300. The routing path N' 312 overlaps a first portion of the routing path N 302 connecting to the source 300 shown by the darkened line 313 in FIG. 3B. The node L' 314 is placed as close as possible to the load L 304 to minimize routing resources required. In a second step illustrated by FIG. 3C, a source S' 310 is created and connected by a routing path N" 322 to the load L 304. The routing path N" 322 overlaps a second portion 323 of the routing path N 302 connecting to the load L 300 as shown by the darkened line. The first portion 313 and second portion 323 of the routing path N 302 covered by darkened portions of the paths N' 312 and N" 322 combine to cover all routing resources used by the path N 302. The source S' is placed as close as possible to the load L to minimize routing resource overhead.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for testing a routing network that includes a primary routing path connecting the output of a first source node to the input of a first load node, the method comprising:
creating a second source node configured as a pattern generator which is not a part of the primary routing path;
creating a first alternative routing path linking the second source node to the first load node, the first alternative routing path overlapping a first portion of the primary routing path;
creating a second load node configured as an observation point which is not a part of the primary routing path;
providing a second alternative routing path linking the first source node to the second load node, the second alternative routing path overlapping a second portion of the primary routing path;
wherein the first portion and the second portion of the primary routing path comprise a portion of the primary routing path, where remaining portions of the primary routing path are provided by a test of the first source node and the first load node; and
testing the primary routing path using the second source node and the second load node which are not a part of the primary routing path.

2. The method of claim 1, wherein the second source node generates test signal patterns for transmission to the first load node over the first alternative routing path that cannot be provided from the first source node over the primary routing path.

3. The method of claim 1, wherein the routed network is included in a Field Programmable Gate Array (FPGA).

4. The method of claim 3, wherein the second source node is located in the FPGA as close proximity as possible in the FPGA to the first source node.

5. The method of claim 1, wherein the second source node is programmed into a Field Programmable Gate Array (FPGA).

6. The method of claim 1, wherein the primary routing path, the first alternative routing path and the second alternative routing path are included in a Field Programmable Gate Array (FPGA).

7. A method for testing a routing network that includes a primary routing path connecting the output of a first source node to the input of a first load node, the method comprising:
creating a second source node configured as a pattern generator which is not a part of the primary routing path;
creating a first alternative routing path linking the second source node to the first load node, the first alternative routing path overlapping a first portion of the primary routing path;
wherein a test of the first source node covers a second portion of the primary routing path, wherein the first portion and the second portion of the primary routing path include all routing resources making up the primary routing path; and
testing the primary routing path using the second source node which is not a part of the primary routing path and the test of the first source node.

8. The method of claim 7, wherein the second source node generates test signal patterns for transmission to the first load node over the first alternative routing path that cannot be provided from the first source node over the primary routing path.

9. The method of claim 7, wherein the second source node, the primary routing path and the alternative routing path are included in a Field Programmable Gate Array (FPGA).

10. A method for testing a routing network that includes a primary routing path connecting the output of a first source node to the input of a first load node, the method comprising:
creating a second load node configured as an observation point which is not a part of the primary routing path;
creating a first alternative routing path linking the second load node to the first source node, the first alternative routing path overlapping a first portion of the primary routing path,
wherein a test of the first load node covers a second portion of the primary routing path, wherein the first portion and the second portion of the primary routing path include all routing resources making up the primary routing path; and
testing the primary routing path using the second load node which is not a part of the primary routing path and the test of the first load node.

11. The method of claim 10, wherein the second load node receives test signal patterns for transmission over the first alternative routing path that cannot be provided to the first load node over the primary routing path.

12. The method of claim 10, wherein the second load node, the primary routing path and the alternative routing path are included in a Field Programmable Gate Array (FPGA).

13. The method of claim 10, wherein the second load node is located in a Field Programmable Gate Array FPGA in as close proximity as possible to the first load node.

14. The method of claim 10, wherein the primary routing path, and the first alternative routing path are included in a Field Programmable Gate Array (FPGA).

* * * * *